US012029026B2

(12) United States Patent
Wang et al.

(10) Patent No.: US 12,029,026 B2
(45) Date of Patent: Jul. 2, 2024

(54) METHOD OF MANUFACTURING SEMICONDUCTOR STRUCTURE AND SEMICONDUCTOR STRUCTURE (71) Applicant: CHANGXIN MEMORY TECHNOLOGIES, INC., Hefei (CN)

(72) Inventors: Xiaoling Wang, Hefei (CN); Hai-Han Hung, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 418 days.

(21) Appl. No.: 17/453,046

(22) Filed: Nov. 1, 2021

(65) Prior Publication Data

US 2023/0049203 A1 Feb. 16, 2023

Related U.S. Application Data (63) Continuation of application No. PCT/CN2021/113310, filed on Aug. 18, 2021.

(30) Foreign Application Priority Data

Aug. 12, 2021 (CN) .......................... 202110926432.5

(51) Int. Cl.
H01L 27/108 (2006.01)
H01L 29/78 (2006.01)
(Continued)

(52) U.S. Cl.
CPC ......... *H10B 12/05* (2023.02); *H01L 29/7853* (2013.01); *H01L 29/78642* (2013.01); *H10B 12/315* (2023.02); *H10B 12/482* (2023.02)

(58) Field of Classification Search
CPC . G06T 1/00; G06F 3/044; G06F 3/041; H01L 27/146; H01L 27/14643;
(Continued)

(56) References Cited

U.S. PATENT DOCUMENTS 5,612,563 A * 3/1997 Fitch ................. H01L 21/76897
257/E29.267
8,274,112 B2 9/2012 Kim et al.
(Continued)

FOREIGN PATENT DOCUMENTS

CN 101783348 A 7/2010
CN 103474464 A 12/2013
(Continued)

OTHER PUBLICATIONS

International Search Report cited in PCT/CN2021/113310, mailed May 7, 2022, 8 pages.

Primary Examiner — Jarrett J Stark
(74) Attorney, Agent, or Firm — Kilpatrick Townsend & Stockton LLP (57) ABSTRACT The present disclosure provides a method of manufacturing a semiconductor structure and a semiconductor structure, relating to the technical field of semiconductors. The method of manufacturing a semiconductor structure includes: providing a substrate; forming active pillars arranged in an array on the substrate, a projection shape of a longitudinal section of each of the active pillars includes a cross shape; forming a first oxide layer on the substrate, where a filling region is formed between adjacent active pillars in the same row; sequentially forming a word line and a dielectric layer in the filling region; exposing a top surface of each of the active pillars; forming a contact layer on the active pillars; and forming a capacitor structure on the contact layer.

9 Claims, 10 Drawing Sheets (51) Int. Cl.
*H01L 29/786* (2006.01)
*H10B 12/00* (2023.01)

(58) Field of Classification Search
CPC ........... H01L 27/1214; H01L 27/14689; H01L 27/1248; H01L 27/14612; H01L 27/14683; G06V 40/1318; A61B 5/1172; G01J 1/42; G01J 1/4204
See application file for complete search history.

(56) References Cited

U.S. PATENT DOCUMENTS

| | | | |
|---|---|---|---|
| 9,825,032 B1* | 11/2017 | Bentley | H01L 21/823418 |
| 9,870,957 B2 | 1/2018 | Jeong et al. | |
| 9,997,413 B1* | 6/2018 | Leobandung | H01L 27/092 |
| 10,777,468 B1* | 9/2020 | Zhang | H01L 21/823885 |
| 11,081,546 B2* | 8/2021 | Li | H01L 27/0688 |
| 2005/0164454 A1* | 7/2005 | Leslie | H01L 29/78648 |
| | | | 438/269 |
| 2007/0111455 A1 | 5/2007 | Kim et al. | |
| 2010/0052055 A1* | 3/2010 | Takeuchi | H01L 29/78642 |
| | | | 257/351 |
| 2016/0035889 A1 | 2/2016 | Huang et al. | |
| 2019/0296155 A1* | 9/2019 | Sawabe | H01L 29/66969 |
| 2020/0105537 A1* | 4/2020 | Wang | H01L 21/823821 |
| 2020/0328127 A1* | 10/2020 | Yamashita | H01L 29/0847 |
| 2021/0066135 A1* | 3/2021 | Pandey | H01L 29/1037 |
| 2021/0280700 A1* | 9/2021 | Wernersson | H01L 29/775 |
| 2021/0296316 A1* | 9/2021 | Zhu | H01L 29/045 |
| 2021/0296319 A1* | 9/2021 | Sukekawa | H10B 12/482 |
| 2021/0335789 A1* | 10/2021 | Zhu | H01L 29/78642 |
| 2022/0181321 A1* | 6/2022 | Kang | H03K 19/173 |
| 2023/0107258 A1* | 4/2023 | Lee | H01L 27/092 |
| | | | 257/288 |
| 2024/0097044 A1* | 3/2024 | Kasahara | H10B 12/33 |

FOREIGN PATENT DOCUMENTS

| | | |
|---|---|---|
| CN | 107527909 A | 12/2017 |
| CN | 110957319 A | 4/2020 |
| CN | 112164701 A | 1/2021 |
| WO | 2020112710 A1 | 6/2020 |

* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Patent Application No. PCT/CN2021/113310, filed on Aug. 18, 2021, which claims the priority to Chinese Patent Application No. 202110926432.5, titled "METHOD OF MANUFACTURING SEMICONDUCTOR STRUCTURE AND SEMICONDUCTOR STRUCTURE" and filed on Aug. 12, 2021. The entire contents of International Patent Application No. PCT/CN2021/113310 and Chinese Patent Application No. 202110926432.5 are incorporated herein by reference.

TECHNICAL FIELD

The present disclosure relates to, but is not limited to, a method of manufacturing a semiconductor structure and a semiconductor structure.

BACKGROUND

The dynamic random access memory (DRAM) has a small size, a high degree of integration, and low power consumption, and is faster than all read-only memory (ROM). With the development of the semiconductor industry, to optimize the integration is one of the main goals of the circuit design. However, with the continuous scaling of the critical dimension of the DRAM and other devices, the size of transistors is getting smaller, the gate control capability of the transistors is weakened, and the short-channel effect becomes more obvious, thus reducing the performance of the semiconductor structure.

SUMMARY

An overview of the subject matter detailed in the present disclosure is provided below, which is not intended to limit the protection scope of the claims.

The present disclosure provides a method of manufacturing a semiconductor structure and a semiconductor structure.

According to a first aspect, the embodiments of the present disclosure provide a method of manufacturing a semiconductor structure. The method of manufacturing a semiconductor structure includes:

providing a substrate;

forming multiple active pillars on the substrate, where the active pillars are arranged in an array, and taking a plane perpendicular to the substrate as a longitudinal section, a projection shape of each of the active pillars on the longitudinal section includes a cross shape;

forming a first oxide layer on the substrate, where the first oxide layer covers a top surface of the substrate and sidewalls and a top surface of each of the active pillars, and a filling region is formed between two adjacent active pillars in the same row;

sequentially forming a word line and a dielectric layer in the filling region;

removing a part of the first oxide layer and a part of the dielectric layer to expose the top surface of each of the active pillars;

forming a contact layer on the top surface of each of the active pillars; and forming a capacitor structure on the contact layer.

According to a second aspect, the embodiments of the present disclosure provide a semiconductor structure, which is obtained by the foregoing method of manufacturing a semiconductor structure. The semiconductor structure includes:

a substrate; and active pillars, where the active pillars are arranged in an array, and taking a plane perpendicular to the substrate as a longitudinal section, a projection shape of each of the active pillars on the longitudinal section comprises a cross shape.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and a person of ordinary skill in the art may still derive other drawings from these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that without conflict, the embodiments in the present disclosure and features in the embodiments may be combined with each other.

In the semiconductor structure, with the continuous scaling of the critical dimension of the DRAM and other devices, the size of transistors is getting smaller, the gate control ability of the transistors is weakened, and the short-channel effect becomes more obvious, thus reducing the performance of the semiconductor structure.

In view of the foregoing technical problem, in the method of manufacturing a semiconductor structure and the semiconductor structure provided by the embodiments of the present disclosure, the surface area of active pillars is increased, so as to increase the specific surface area of the gate structure, thus effectively improving the gate control capability and performance of the semiconductor structure.

Figure 1:
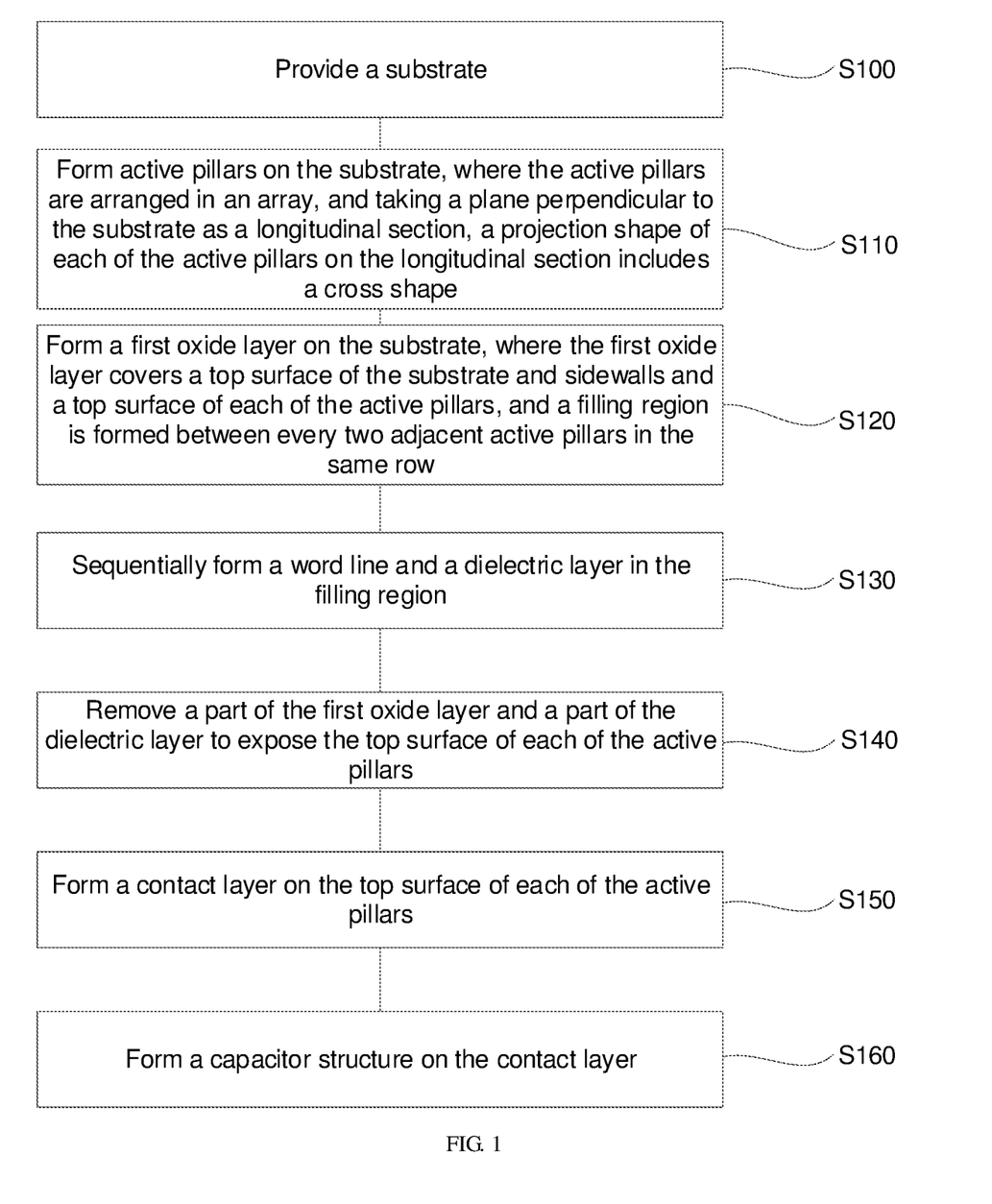
FIG. 1 is a flowchart of a method of manufacturing a semiconductor structure according to an exemplary embodiment.

FIG. 1 is a flowchart of a method of manufacturing a semiconductor structure according to an embodiment of the present disclosure; FIG. 2 to FIG. 15 are schematic diagrams of various stages in the method of manufacturing a semiconductor structure. The method of manufacturing a semiconductor structure is described in detail below with reference to FIG. 2 to FIG. 15.

The semiconductor structure is not limited in this embodiment. The semiconductor structure is described below by taking a dynamic random access memory (DRAM) as an example, but this embodiment is not limited to this, and the semiconductor structure in this embodiment may also be other structures.

Figure 2:
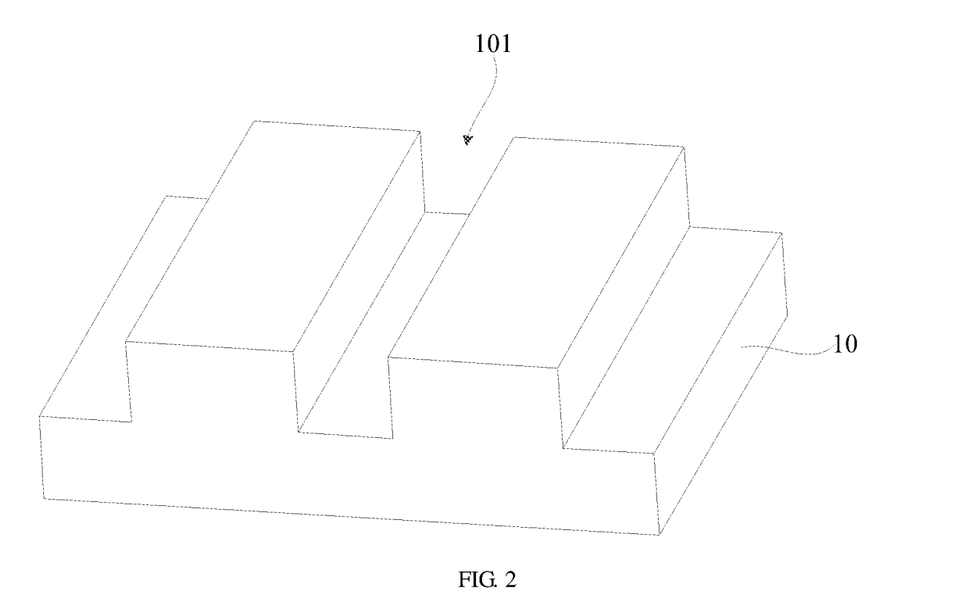
FIG. 2 is a schematic diagram of forming first grooves in a substrate in a method of manufacturing a semiconductor structure according to an exemplary embodiment.

As shown in FIG. 2, an embodiment of the present application provides a method of manufacturing a semiconductor structure. The method of manufacturing a semiconductor structure includes the following steps:

Step S100: Provide a substrate.

Step S110: Form active pillars on the substrate, where the active pillars are arranged in an array, and taking a plane perpendicular to the substrate as a longitudinal section, a projection shape of each of the active pillars on the longitudinal section includes a cross shape.

Step S120: Form a first oxide layer on the substrate, where the first oxide layer covers a top surface of the substrate and sidewalls and a top surface of each of the active pillars, and a filling region is formed between two adjacent active pillars in the same row.

Step S130: Sequentially form a word line and a dielectric layer in the filling region.

Step S140: Remove a part of the first oxide layer and a part of the dielectric layer to expose the top surface of each of the active pillars.

Step S150: Form a contact layer on the top surface of each of the active pillars.

Step S160: Form a capacitor structure on the contact layer.

For example, in step S100, as shown in FIG. 2, the substrate 10 serves as a support member of a memory and is used to support other components provided thereon. The substrate 10 may be made of a semiconductor material. The semiconductor material may be one or more of the following: silicon, germanium, silicon-germanium, and silicon-carbon.

Figure 5:
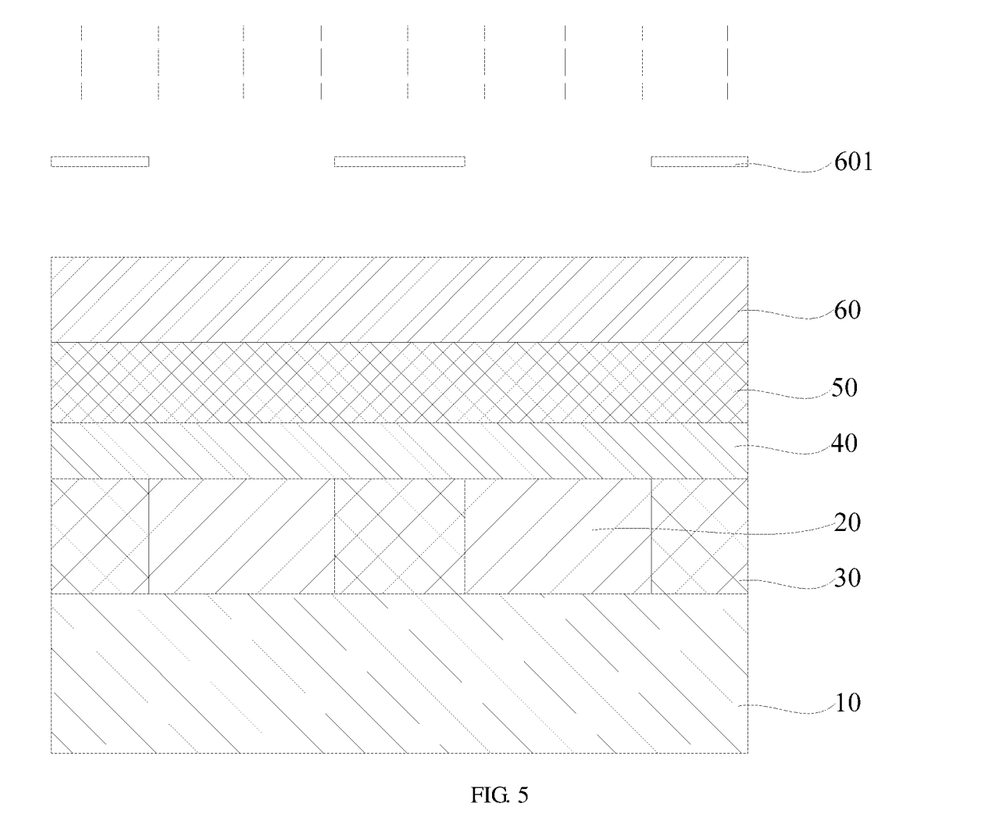
FIG. 5 is a schematic diagram of forming a first dielectric layer, a first photoresist layer, and a second photoresist layer in a method of manufacturing a semiconductor structure according to an exemplary embodiment.

For example, in step S110, as shown in FIG. 5, a first dielectric layer 40, a first photoresist layer 50, and a second photoresist layer 60 that are sequentially stacked can be formed on the substrate 10 by an atomic layer deposition process, a chemical vapor deposition process, or a physical vapor deposition process. The first dielectric layer 40 may include a silicon oxide layer and a silicon nitride layer, and the photosensitivity of the first photoresist layer 50 is higher than that of the second photoresist layer 60.

Figure 6:
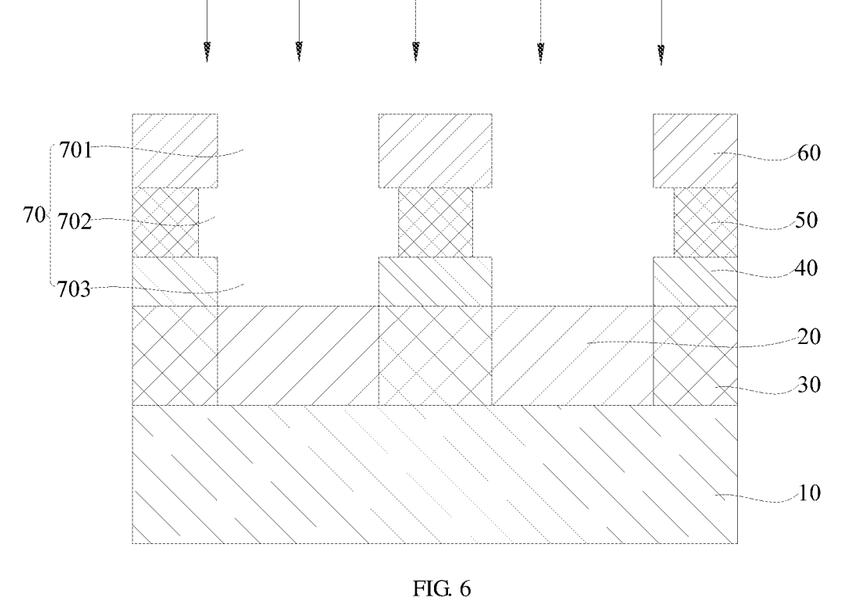
FIG. 6 is a schematic diagram of forming second grooves in a method of manufacturing a semiconductor structure according to an exemplary embodiment.

As shown in FIG. 6, a part of the second photoresist layer 60, a part of the first photoresist layer 50, and a part of the first dielectric layer 40 are removed, to form the second grooves 70, where the bottom of each of the second grooves 70 exposes the top surface of the substrate 10. Taking the plane perpendicular to the substrate 10 as the longitudinal section, the projection shape of each of the formed second grooves 70 on the longitudinal section comprises a cross shape.

Figure 7:
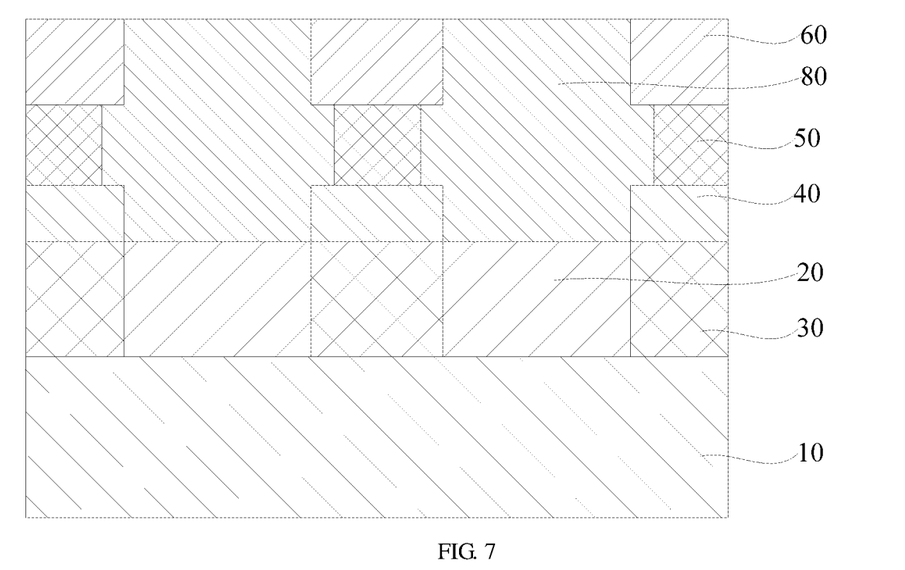
FIG. 7 is a schematic diagram of forming silicon pillars in a method of manufacturing a semiconductor structure according to an exemplary embodiment.

For example, as shown in FIG. 7, silicon pillars 80 are formed in the second grooves 70, where a top surface of each of the silicon pillars 80 is flush with the top surface of the second photoresist layer 60. In some embodiments, the silicon pillars 80 can be formed by silicon epitaxial growth along the inner walls of the second grooves 70, and an outer surface layer of each of the silicon pillars 80 forms a cross-shaped structure along the cross-shaped inner wall, to effectively increase the surface area of the subsequently formed active pillars 90, thereby increasing the specific surface area of the subsequently formed gate structure and improving the gate control capability and performance of the semiconductor structure.

Figure 8:
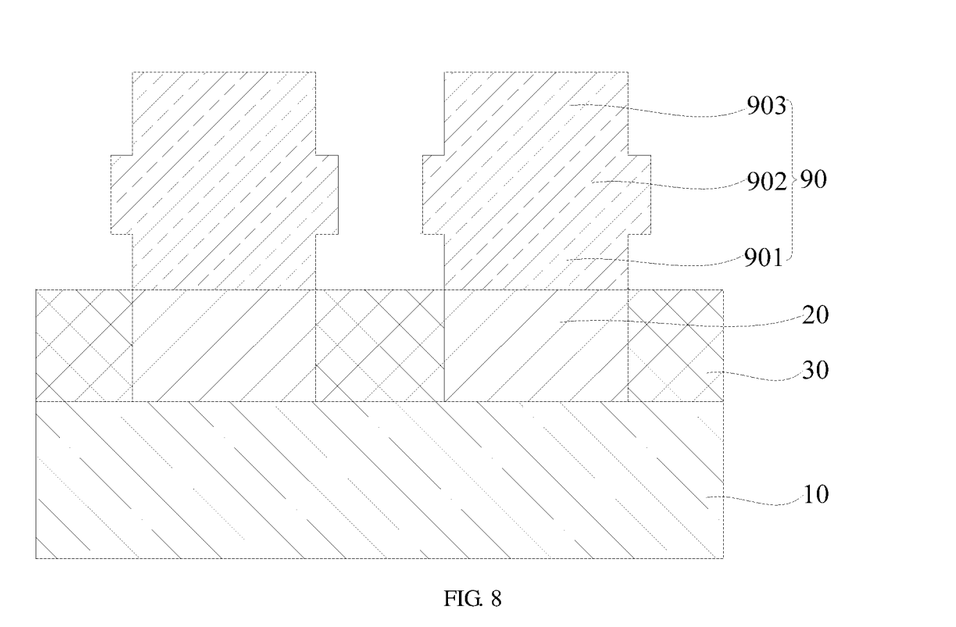
FIG. 8 is a schematic diagram of forming active pillars in a method of manufacturing a semiconductor structure according to an exemplary embodiment.

As shown in FIG. 8, a top surface of the silicon pillar 80 is doped with ions by ion implantation, to form the active pillar 90. The doped ions include one of the following: nitrogen ions, phosphorus ions, boron ions or germanium ions, etc.

With reference to FIG. 6, the retained second photoresist layer 60, the retained first photoresist layer 50, and the retained first dielectric layer 40 are removed by plasma etching. An etching gas includes at least one of the following: oxygen, helium, argon, nitrogen, and nitrogen tetrafluoride.

Figure 9:
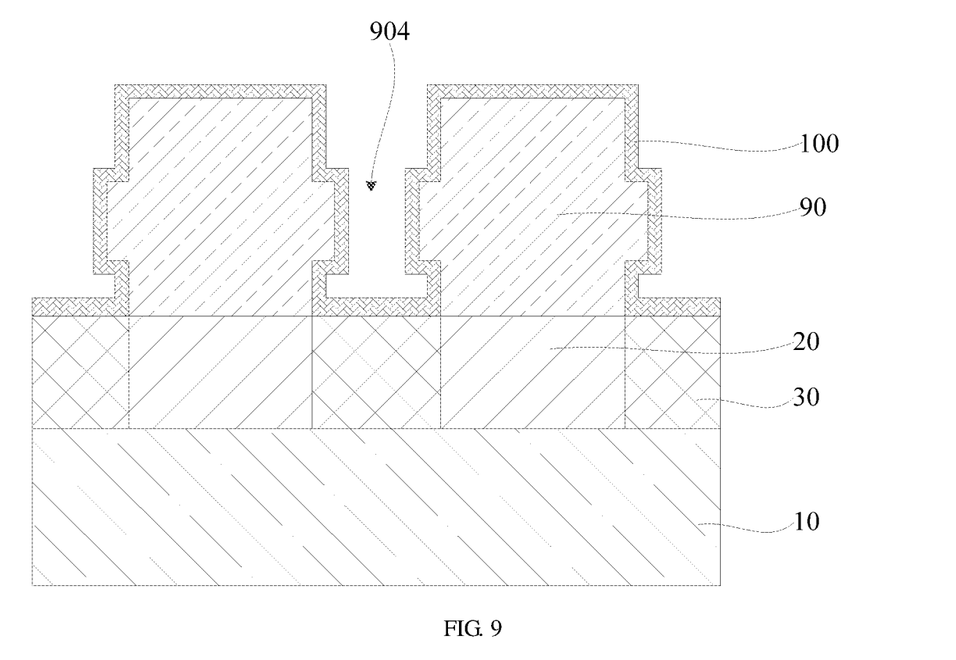
FIG. 9 is a schematic diagram of forming a first oxide layer in a method of manufacturing a semiconductor structure according to an exemplary embodiment.

For example, in step S120, as shown in FIG. 9, a first oxide layer 100 is formed on the top surface and sidewalls of each of the active pillar 90 and the top surface of the substrate 10 by an atomic layer deposition process. The first oxide layer includes a silicon dioxide layer. A filling region 904 is formed between two adjacent active pillars 90 covered by the first oxide layer 100.

Figure 10:
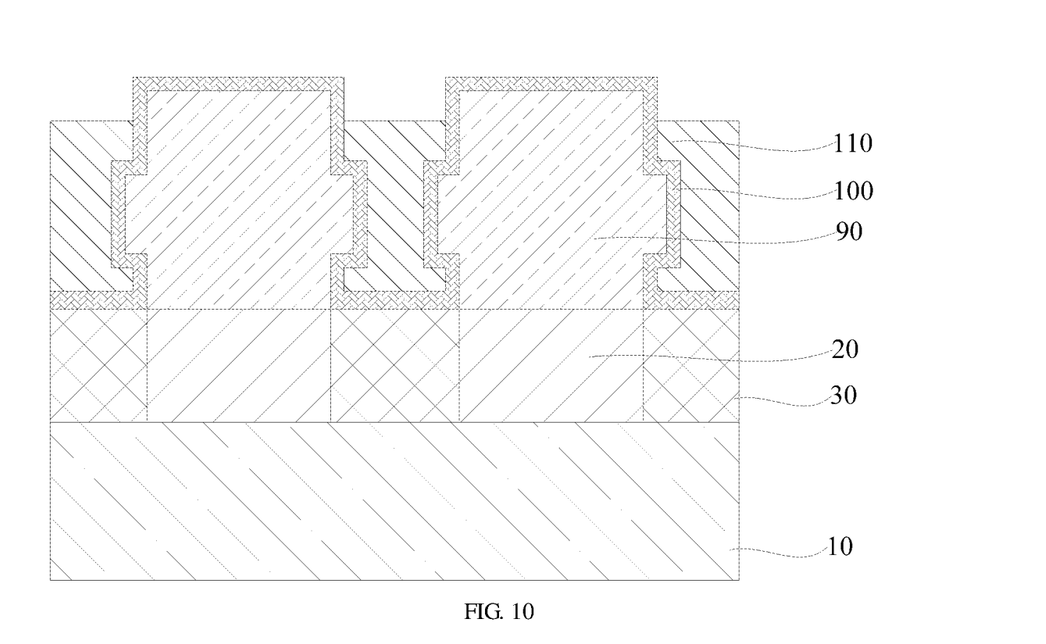
FIG. 10 is a schematic diagram of forming word lines in a method of manufacturing a semiconductor structure according to an exemplary embodiment.

For example, in step S130, as shown in FIG. 10, word lines 110 are formed in the filling regions 904 respectively. Each of the word lines 110 is a metal layer, where the metal layer includes at least one of a tungsten layer, copper layer, or a titanium nitride layer. The top surfaces of the formed word lines 110 are lower than the top surfaces of the active pillars 90.

Figure 11:
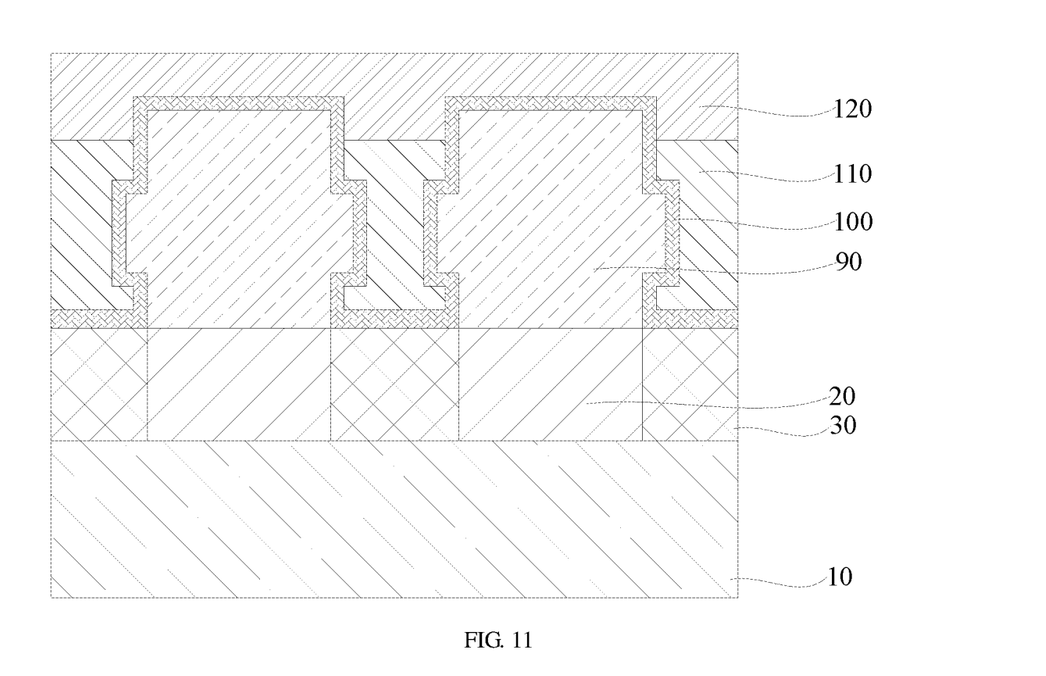
FIG. 11 is a schematic diagram of forming a dielectric layer in a method of manufacturing a semiconductor structure according to an exemplary embodiment.

As shown in FIG. 11, a dielectric layer 120 is formed on the word lines 110, where the dielectric layer 120 covers a top surface of each of the word lines 110 and the top surface and sidewalls of the first oxide layer 100. A material of the dielectric layer 120 includes silicon dioxide or the like.

Figure 12:
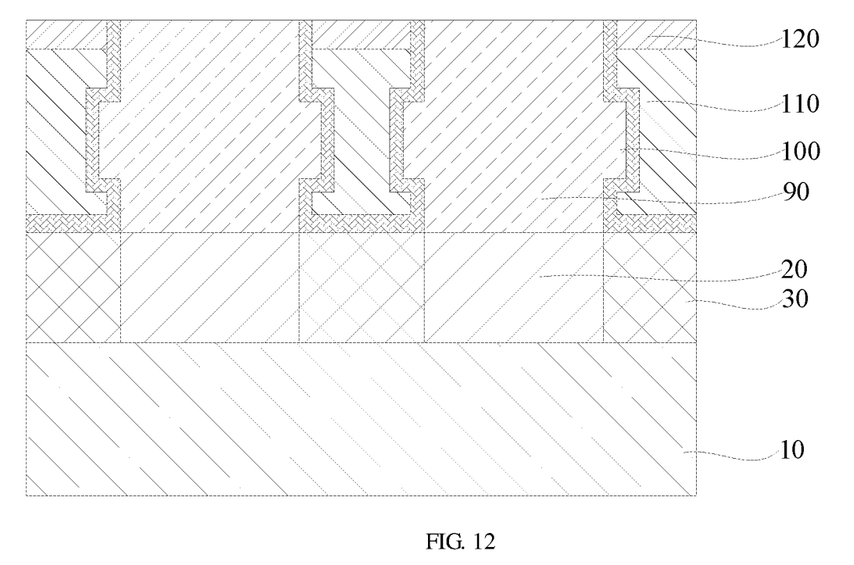
FIG. 12 is a schematic diagram of removing a part of a dielectric layer and a part of a first oxide layer in a method of manufacturing a semiconductor structure according to an exemplary embodiment.

For example, in step S140, as shown in FIG. 12, a part of each of the oxide layer 100 and a part of the dielectric layer 120 can be removed may by chemical mechanical grinding, and the top surface of each of the active pillars 90 is exposed.

Figure 13:
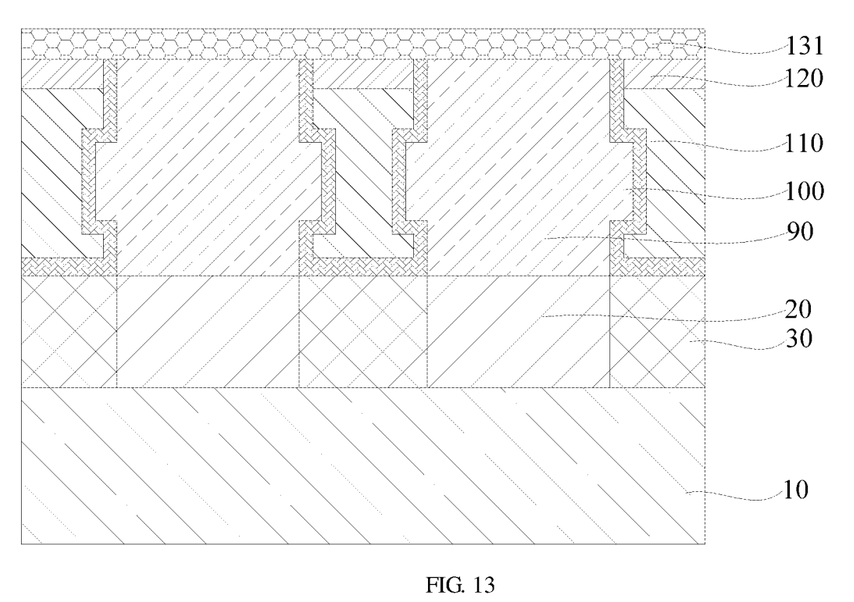
FIG. 13 is a schematic diagram of forming an initial metal layer in a method of manufacturing a semiconductor structure according to an exemplary embodiment.

For example, in step S150, as shown in FIG. 13, an initial metal layer 131 is formed on a top surface of the retained dielectric layer 120 and the top surface of each of the active pillars 90 by a physical vapor deposition process.

A part of the initial metal layer 131 is removed, and the corresponding initial metal layer 131 located the top surface of each of the active pillars 90 is removed, to form a metal layer 130.

Figure 14:
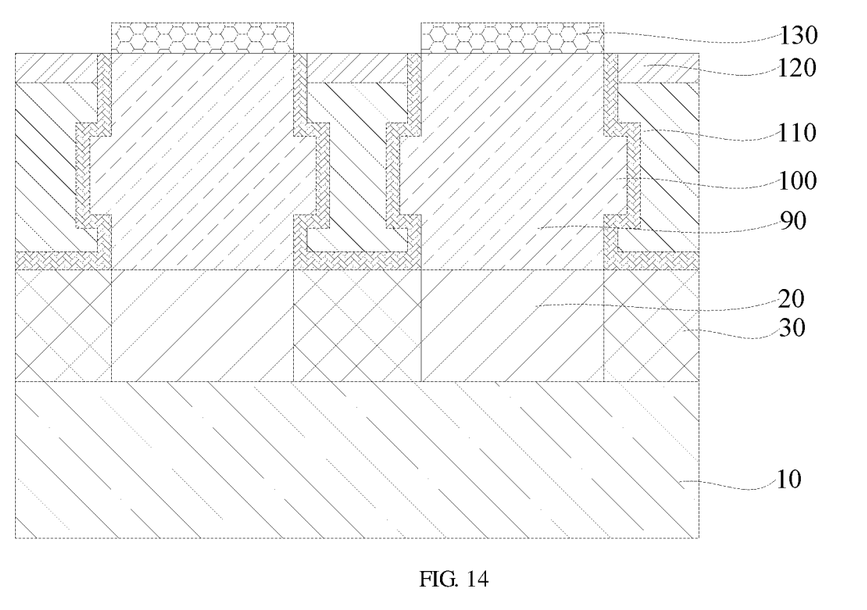
FIG. 14 is a schematic diagram of forming a contact layer in a method of manufacturing a semiconductor structure according to an exemplary embodiment.

As shown in FIG. 14, high-temperature tempering is performed on the metal layer 130 to form a metal silicide, i.e., the contact layer 140. The metal layer 130 includes at least one of a cobalt layer, a nickel layer or a platinum layer. The contact layer 140 include at least one of a cobalt compound, a nickel compound or a platinum compound.

Figure 15:
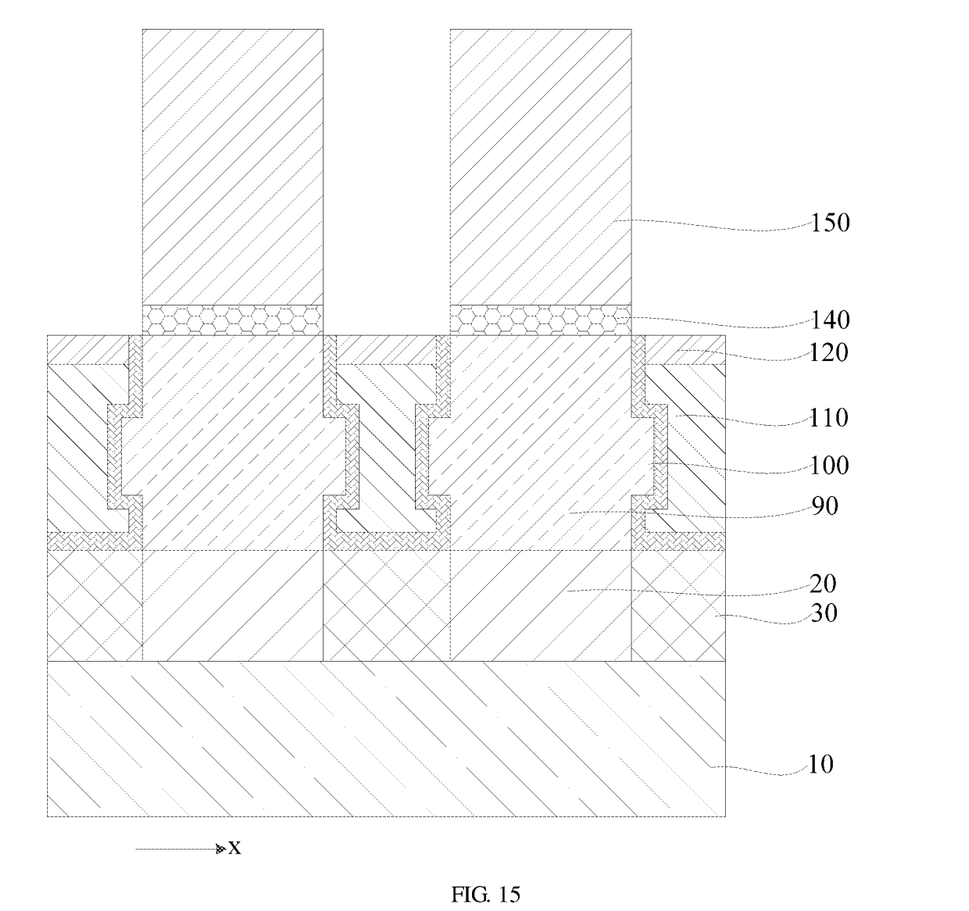
FIG. 15 is a schematic diagram of forming a capacitor structure in a method of manufacturing a semiconductor structure according to an exemplary embodiment.

For example, in step S160, as shown in FIG. 15, the capacitor structure 150 is formed on the contact layer 140, where the capacitor structure 150 may include a columnar capacitor structure, a cup-shaped capacitor structure or a trench-type capacitor structure.

In the method of manufacturing a semiconductor structure provided by the embodiments of the present disclosure, the surface area of the active pillars is increased, so as to increase the specific surface area of the gate structure, thus effectively improving the gate control capability and performance of the semiconductor structure.

According to an exemplary embodiment, as shown in FIG. 6 and FIG. 7, this embodiment describes an implementation manner of step S110 of forming the second grooves 70 in the foregoing embodiment.

Step S111: Remove a part of the second photoresist layer by a plasma etching process, such that the retained second photoresist layer forms upper grooves.

With reference to FIG. 6 and FIG. 7, a mask plate 601 with openings is provided on the second photoresist layer 60, and a mask pattern is formed on the second photoresist layer 60 by exposure or photo-etching.

By using the mask pattern on the second photoresist layer 60 as a mask plate, the second photoresist layer 60 exposed in the mask pattern is etched with an etching solution or etching gas, and the retained second photoresist layer 60 forms upper grooves 701. An etching gas includes at least one of the following: oxygen, helium, argon, nitrogen, and carbon tetrafluoride.

Step S112: Remove a part of the first photoresist layer, such that the retained first photoresist layer forms middle grooves.

With reference to FIG. 7, the first photoresist layer 50 is continuously etched with the foregoing etching gas, and the retained first photoresist layer 50 forms middle grooves 702. It should be noted that, since the photosensitivity of the first photoresist layer 50 is higher than that of the second photoresist layer 60, when the first photoresist layer 50 and the second photoresist layer 60 are etched with the etching gas, an etching area in the first photoresist layer 50 is larger than an etching area in the second photoresist layer 60. That is, taking the plane perpendicular to the substrate as the longitudinal section, a length of the etching area in the first photoresist layer 50 is greater than a length of the etching area in the second photoresist layer 60.

Step S113: Remove a part of the first dielectric layer, such that the retained first dielectric layer forms lower grooves, where a bottom surface of one lower groove exposes a top surface of one bit line.

With reference to FIG. 7, the first dielectric layer 40 is continuously etched with the foregoing etching gas, and the retained first dielectric layer 40 forms lower grooves 703. Taking the plane perpendicular to the substrate as the longitudinal section, a length of an etching area in the first dielectric layer 40 is equal than a length of an etching area in the second photoresist layer 60.

As shown in FIG. 7, a upper groove 701, a middle groove 702, and a lower groove 703 are sequentially connected to form a second groove 70. A projection area of each of the middle grooves 702 on the substrate 10 is greater than a projection area of each of the upper grooves 701 on the substrate 10, and the projection area of each of the middle grooves 702 on the substrate 10 is greater than a projection area of each of the lower grooves 703 on the substrate 10. In this way, taking the plane perpendicular to the substrate 10 as the longitudinal section, a projection shape of each of the second groove 70 is a cross shape, to effectively increase the surface area of the subsequently formed active pillars, thereby improving the gate control capability of the semiconductor structure and improving the performance of the semiconductor structure.

Figure 16:
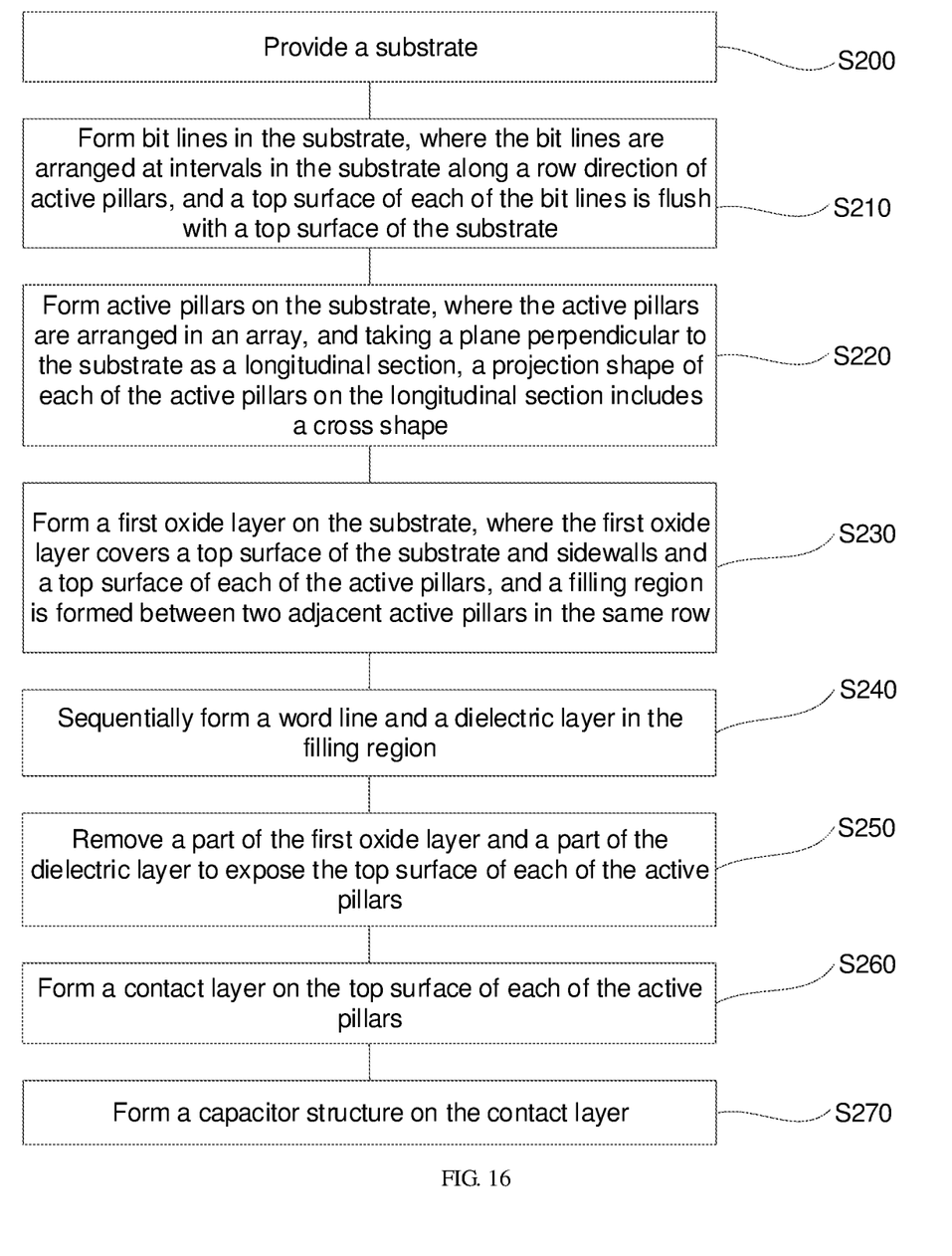
FIG. 16 is a flowchart of a method of manufacturing a semiconductor structure according to an exemplary embodiment.

According to an exemplary embodiment, as shown in FIG. 16, FIG. 16 shows a flowchart of a method of manufacturing a semiconductor structure according to this embodiment. The method of manufacturing a semiconductor structure includes:

Step S200: Provide a substrate.

Step S210: Form bit lines in the substrate, where the bit lines are arranged at intervals in the substrate along a row direction of active pillars, and a top surface of each of the bit lines is flush with a top surface of the substrate.

Step S220: Form active pillars on the substrate, where the active pillars are arranged in an array, and taking a plane perpendicular to the substrate as a longitudinal section, a projection shape of each of the active pillars on the longitudinal section includes a cross shape.

Step S230: Form a first oxide layer on the substrate, where the first oxide layer covers a top surface of the substrate and sidewalls and a top surface of each of the active pillars, and a filling region is formed between two adjacent active pillars in the same row.

Step S240: Sequentially form a word line and a dielectric layer in the filling region.

Step S250: Remove a part of the first oxide layer and a part of the dielectric layer to expose the top surface of each of the active pillars.

Step S260: Form a contact layer on the top surface of each of the active pillars.

Step S270: Form a capacitor structure on the contact layer.

For example, step S210 of forming bit lines includes the following steps:

Step S211: Form, in the substrate, multiple first grooves that are arranged at intervals along the row direction of the active pillars.

With reference to FIG. 2, a mask layer can be formed on the substrate 10 by a deposition process, and then the mask layer is patterned to form multiple mask openings that are arranged at intervals along the row direction of the multiple active pillars.

A third photoresist layer can be formed on the mask layer, and a mask pattern is formed on the third photoresist layer by exposure or development etching; a part of the mask layer is removed by using the third photoresist layer with the mask pattern as a mask plate, to form multiple mask openings arranged at intervals.

In this embodiment, by transferring the mask pattern to the mask layer and then etching the substrate 10 by using the mask layer as the mask plate, the accuracy of the pattern transfer and the performance of the semiconductor structure can be improved.

After the mask openings are formed, the substrate 10 exposed in each mask opening is removed by using an etching solution or etching gas to form multiple first grooves 101 in the substrate 10.

After the first grooves 101 are formed, the mask layer retained on the top surface of the substrate 10 is removed.

Figure 3:
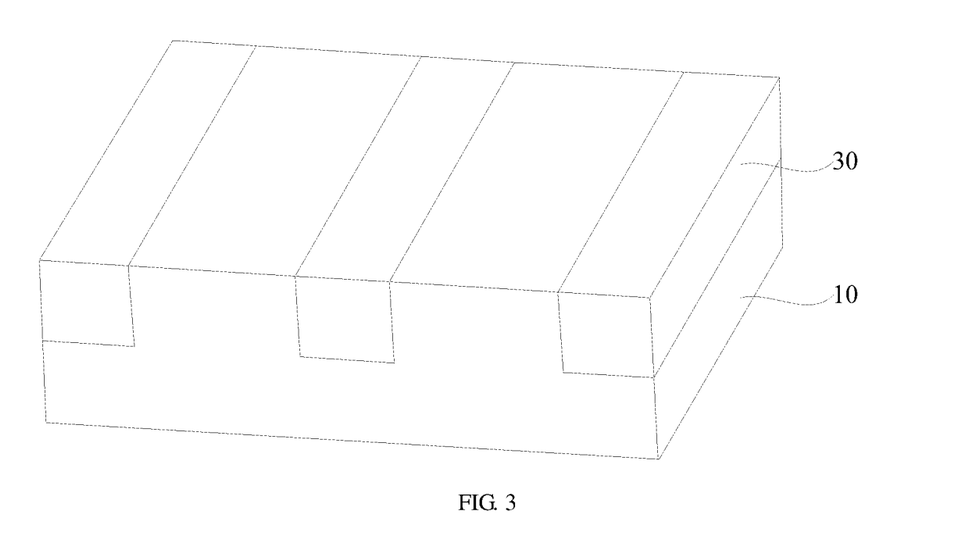
FIG. 3 is a schematic diagram of forming an insulating dielectric layer in a method of manufacturing a semiconductor structure according to an exemplary embodiment.

Step S212: Form an insulating dielectric layer in the first grooves, where a top surface of the insulating dielectric layer is flush with the top surface of the substrate, and a region between two adjacent parts of the insulating dielectric layer forms an active region.

As shown in FIG. 3, the insulating dielectric layer 30 is formed in the first grooves 101 by physical vapor deposition, chemical vapor deposition, spin coating or a combination thereof, where the top surface of the insulating dielectric layer 30 is flush with the top surface of the substrate 10. A material used to form the insulating dielectric layer 30 may be, for example, silicon oxide, silicon nitride or other suitable insulating substances (e.g., organic polymer compounds) or a combination of the above materials. A region between two adjacent parts of the insulating dielectric layer 30 forms an active region.

Figure 4:
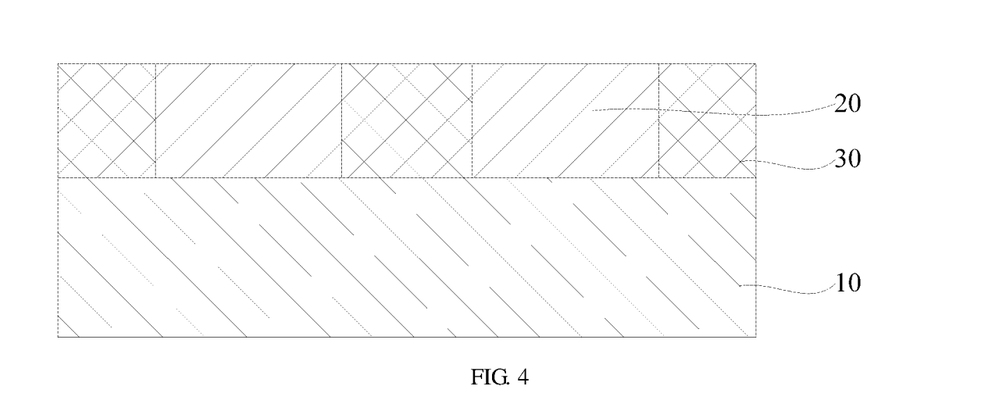
FIG. 4 is a schematic diagram of forming bit lines in a method of manufacturing a semiconductor structure according to an exemplary embodiment.

Step S213: Dope the active regions with ions by ion implantation, to form the bit lines.

As shown in FIG. 4, doped ions can be injected into the active regions by ion implantation. The doped ions include one of the following: nitrogen ions, phosphorus ions, boron ions or germanium ions, etc., thus forming the bit lines 20.

In the method of manufacturing a semiconductor structure provided by the embodiments of the present disclosure, the surface area of the active pillars is increased, so as to increase the specific surface area of the gate structure, thus effectively improving the gate control capability and performance of the semiconductor structure.

As shown in FIG. 16, an embodiment of the present disclosure further provides a semiconductor structure. The semiconductor structure includes a substrate 10 and active pillars 90, where the active pillars 90 are arranged in an array on the substrate 10, and taking a plane perpendicular to the substrate 10 as a longitudinal section, a projection shape of each of the active pillars 90 on the longitudinal section includes a cross shape.

In some embodiments, each of the active pillars 90 includes a first segment 901, a second segment 902, and a third segment 903, where the first segment 901 is connected to the substrate 10, a projection area of the second segment 902 on the substrate 10 is greater than a projection area of the first segment 901 on the substrate 10, and the projection area of the second segment 902 on the substrate 10 is greater than a projection area of the third segment 903 on the substrate 10. The structural design of the first segment 901, the second segment 902, and the third segment 903 increases the surface area of the active pillar 90, so as to increase the specific surface area of the gate structure, thus effectively improving the gate control capability and performance of the semiconductor structure.

In some embodiments, the projection area of the first segment 901 on the substrate 10 is equal to the projection area of the third segment 903 on the substrate 10; or the projection area of the first segment 901 on the substrate 10 is greater than or less than the projection area of the third segment 903 on the substrate 10.

In some embodiments, the semiconductor structure further includes bit lines 20 in the substrate 10, where the bit lines 20 are arranged at intervals along a row direction of the active pillars 90, that is, direction X shown in FIG. 15, and a top surface of the bit line 20 is connected to a bottom surface of the active pillar 90.

In some embodiments, the semiconductor structure further includes word lines 110 that are arranged at intervals along a column direction of the active pillars 90, where each of the word lines 110 connects active pillars 90 in the same row; the column direction of the active pillars 90 is perpendicular to direction X in FIG. 15, and direction X and the column direction are in the same horizontal plane.

In some embodiments, a contact layer 140 is provided on top surface of each of the active pillars 90, and a capacitor structure 150 is connected on the contact layer 140. A shape of the capacitor structure 150 includes a columnar shape or a cylindrical shape. For example, the capacitor structure 150 may include a columnar capacitor structure, a cup-shaped capacitor structure, or a trench-type capacitor structure.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

INDUSTRIAL APPLICABILITY

In the method of manufacturing a semiconductor structure and the semiconductor structure provided by the embodiments of the present disclosure, the surface area of active pillars is increased, so as to increase the specific surface area of the gate structure, thus effectively improving the gate control capability and performance of the semiconductor structure.

The invention claimed is:

1. A method of manufacturing a semiconductor structure, comprising:
   providing a substrate;
   forming multiple active pillars on the substrate, wherein the active pillars are arranged in an array, and taking a plane perpendicular to the substrate as a longitudinal section, a projection shape of each of the active pillars on the longitudinal section comprises a cross shape;
   forming a first oxide layer on the substrate, wherein the first oxide layer covers a top surface of the substrate and sidewalls and a top surface of each of the active pillars, and a filling region is formed between two adjacent active pillars in the same row;
   sequentially forming a word line and a dielectric layer in the filling region;
   removing a part of the first oxide layer and a part of the dielectric layer to expose the top surface of each of the active pillars;
   forming a contact layer on the top surface of each of the active pillars; and
   forming a capacitor structure on the contact layer.

2. The method of manufacturing a semiconductor structure according to claim 1, wherein each of the active pillars comprises a first segment, a second segment, and a third segment that are sequentially connected, the first segment is connected to the substrate, a projection area of the second segment on the substrate is greater than a projection area of the first segment on the substrate, and the projection area of the second segment on the substrate is greater than a projection area of the third segment on the substrate.

3. The method of manufacturing a semiconductor structure according to claim 1, wherein after the step of providing a substrate and before the step of forming active pillars on the substrate, the method of manufacturing a semiconductor structure further comprises:
   forming bit lines in the substrate, wherein the bit lines are arranged at intervals in the substrate along a row direction of the active pillars, and a top surface of each of the bit lines is flush with the top surface of the substrate.

4. The method of manufacturing a semiconductor structure according to claim 3, wherein the step of forming bit lines in the substrate comprises:
   forming, in the substrate, first grooves that are arranged at intervals along the row direction of the active pillars;
   forming an insulating dielectric layer in the first grooves, wherein a top surface of the insulating dielectric layer is flush with the top surface of the substrate, and a region between two adjacent parts of the insulating dielectric layer forms an active region; and
   doping the active regions with ions by ion implantation, to form the bit lines.

5. The method of manufacturing a semiconductor structure according to claim 4, wherein the step of forming multiple active pillars on the substrate comprises:
   sequentially forming a first dielectric layer, a first photoresist layer, and a second photoresist layer that are stacked on the substrate, wherein a photosensitivity of the first photoresist layer is higher than a photosensitivity of the second photoresist layer;
   removing a part of the second photoresist layer, a part of the first photoresist layer, and a part of the first dielectric layer, such that a retained second photoresist layer, a retained first photoresist layer, and a retained first dielectric layer form second grooves arranged at intervals, wherein one second groove exposes a top surface of one bit line; and
   forming the active pillars in the second grooves, wherein a top surface of each of the active pillars is flush with a top surface of the second photoresist layer.

6. The method of manufacturing a semiconductor structure according to claim 5, wherein the step of removing a part of the second photoresist layer, a part of the first photoresist layer, and a part of the first dielectric layer, such that a retained second photoresist layer, a retained first photoresist layer, and a retained first dielectric layer form second grooves arranged at intervals, wherein one second groove exposes a top surface of one bit line, comprises:
   removing a part of the second photoresist layer by a plasma etching process, such that the retained second photoresist layer forms upper grooves;
   removing a part of the first photoresist layer, such that the retained first photoresist layer forms middle grooves; and
   removing a part of the first dielectric layer, such that the retained first dielectric layer forms lower grooves, wherein a bottom surface of one lower groove exposes a top surface of one bit line;
   wherein a upper groove, a middle groove, and a lower groove are sequentially connected, to form a second groove, a projection area of each of the middle grooves on the substrate is greater than a projection area of each of the upper grooves on the substrate, and the projection area of each of the middle grooves on the substrate is greater than a projection area of each of the lower grooves on the substrate.

7. The method of manufacturing a semiconductor structure according to claim 6, wherein the step of forming the active pillars in the second grooves comprises:
   forming silicon pillars by silicon epitaxial growth along inner walls of the second grooves, wherein a top surface of each of the silicon pillars is flush with a top surface of the second photoresist layer;
   doping the top surface of each of the silicon pillars with ions by ion implantation to form the active pillar; and
   removing the retained second photoresist layer, the retained first photoresist layer, and the retained first dielectric layer.

8. The method of manufacturing a semiconductor structure according to claim 1, wherein after the step of removing a part of the first oxide layer and a part of the dielectric layer to expose the top surface of each of the active pillars, wherein a top surface of a retained dielectric layer is flush with the top surface of each of the active pillars, and before the step of forming a contact layer on the top surface of each of the active pillars, the method of manufacturing a semiconductor structure further comprises:
   forming an initial metal layer on the top surface of the dielectric layer and on the top surface of each of the active pillars;
   removing a part of the initial metal layer, and retaining the initial metal layer located on the top surface of each of the active pillars, to form a metal layer; and
   performing high-temperature tampering process on the metal layer, to form the contact layer.

9. The method of manufacturing a semiconductor structure according to claim 8, wherein the metal layer comprises at least one of a cobalt layer, a nickel layer or a platinum layer; and a material of the contact layer comprises at least one of a cobalt compound, a nickel compound or a platinum compound.

\* \* \* \* \*